United States Patent
Okamoto

(10) Patent No.: US 6,846,615 B2
(45) Date of Patent: Jan. 25, 2005

(54) METHOD FOR MAKING LITHOGRAPHIC PRINTING PLATE

(75) Inventor: Yasuo Okamoto, Shizuoka-ken (JP)

(73) Assignee: Fuji Photo Film Co., Ltd., Minami-Ashigara (JP)

(*) Notice: Subject to any disclaimer, the term of this patent is extended or adjusted under 35 U.S.C. 154(b) by 0 days.

(21) Appl. No.: 10/200,126

(22) Filed: Jul. 23, 2002

(65) Prior Publication Data

US 2003/0118945 A1 Jun. 26, 2003

(30) Foreign Application Priority Data

Jul. 26, 2001 (JP) ........................................ 2001-225733

(51) Int. Cl.⁷ ................................................. G03F 7/26
(52) U.S. Cl. ................. 430/302; 430/281.1; 430/286.1; 430/309; 430/401; 430/434; 430/494; 430/945; 101/463.1
(58) Field of Search .............................. 430/945, 270.1, 430/281.1, 286.1, 287.1, 288.1, 302, 309, 348, 401, 434, 494; 101/463.1

(56) References Cited

U.S. PATENT DOCUMENTS 6,335,144 B1 * 1/2002 Murota et al. ........... 430/281.1
2002/0177071 A1 * 11/2002 Okamoto

FOREIGN PATENT DOCUMENTS

| EP | 0 017 927 A2 | 10/1980 | |
| EP | 0 387 578 A | 9/1990 | |
| EP | 0 464 398 A1 | 1/1992 | |
| EP | 1 048 982 A1 * | 11/2000 | ........... G03F/7/029 |
| EP | 1 243 412 A1 | 9/2002 | |
| JP | 11-265069 A | 9/1999 | |
| JP | 2000-066416 * | 3/2000 | ............. G03F/7/40 |
| JP | 2000-089478 * | 3/2000 | ............. G03F/7/40 |
| JP | 2000-267266 A | 9/2000 | |
| JP | 2001-042546 A | 2/2001 | |
| JP | 2001-042524 * | 2/2004 | ........... G03F/7/029 |
| JP | 2001-100412 * | 4/2004 | ........... G03F/7/031 |
| WO | WO 92/22014 A1 | 12/1992 | |

* cited by examiner

Primary Examiner—Barbara L. Gilliam
(74) Attorney, Agent, or Firm—Burns, Doane, Swecker & Mathis, L.L.P.

(57) ABSTRACT

The present invention provides a method for making a lithographic printing plate, which comprises imagewise exposing a presensitized plate having a photopolymerizable layer on a substrate having a hydrophilic surface by scanning the plate with laser light having a wavelength of 450 nm or shorter, developing the exposed plate with a developer and further exposing the whole surface of the developed plate to light having a wavelength of 450 nm or shorter. The method provides a lithographic printing plate by which a fog of reflection that is easily occurred in an inner drum-type exposing device during a direct process can be reduced to provide a clear image as well as a high printing durability.

8 Claims, No Drawings

METHOD FOR MAKING LITHOGRAPHIC PRINTING PLATE

BACKGROUND OF THE INVENTION

The present invention relates to a method for making a lithographic printing plate comprising a scanning exposure of a presensitized plate having a photopolymerizable layer on a substrate having a hydrophilic surface thereon to laser light.

As a plate useful for making such a lithographic printing plate, there has widely been used a PS plate, which comprises a hydrophilic surface provided thereon with a lipophilic light-sensitive resin layer. The plate-making process for such a lithographic plate currently comprises exposing a PS plate to light rays through images such as an image-carrying lithfilm and then removing the non-image area through dissolution thereof with a developer to thus give a desired printing plate.

There has widely been used digitizing techniques in which image information is electronically processed, accumulated and output using a computer and a variety of new image-outputting techniques have been practically used in response to the development of such digitizing techniques. As the result, the computer-to-plate technique which comprises the steps of incorporation of digitized image information into highly coherent radiant rays such as laser beams and scanning-exposure of a PS plate to the radiant rays to thus directly prepare a printing plate without using any lithfilm, is desired. For this reason, recently it becomes an important technical subject to obtain a PS plate that can be suitably used for this purpose.

For the preparation of a presensitized plate which can be exposed with scanning laser beam, a PS plate having as an ink receptive photosensitive resin layer (hereinafter, referred to as photosensitive layer) made of a photopolymerizable composition which shows an excellent exposing speed, on a hydrophilic substrate has been proposed and been commercially available. The photopolymerizable composition basically consists of an ethylenically unsaturated compound, a photopolymerization initiation system (it is also called as photoinitiation system), and a binder resin. The photoinitiation system absorbs light to generate active radicals to cause addition polymerization of ethylenically unsaturated compound. Thus, the photosensitive layer becomes insolubilized to form an image. With regard to the conventional CTP system utilizing a photopolymerization composition comprising such a photoinitiation system and a light source of visible light source with a long wavelength such as Ar laser (488 nm) and FD-YAG laser (532 nm), it is desired to be written in a higher speed so that the productivity in a process to make a printing plate becomes high. However, the purpose has not been achieved since the output of the light source is not sufficient and the sensitivity of the PS plate is not sufficiently high.

Recently, a semiconductor laser that can continuously oscillate in the range between 350 nm and 450 nm, e.g., laser of InGaN type, is in the practical stage. The scanning exposure system using the light source having such a short wavelength has a merit of constructing an economical system with sufficient output since the semiconductor laser can be made at a low cost. In addition, the system has an advantage that it can be worked under a safelight having a higher lightness than the conventional system using FD-YAG and Ar laser since the PS plate has a short exposure range. In addition, it is still strongly desired in the imaging field to obtain a photoinitiation system having a high sensitivity.

The Japanese Un-examined Patent Publication (hereunder referred to as "J.P. KOKAI") No. 2001-100412 discloses a photosensitive composition which has a photoinitiation system that is highly sensitive to the light having a wavelength of from 350 to 450 nm.

However, such a high sensitive printing plate sometimes occurs a light-fog due to the reflected light (flare light), especially when the exposure of the plate is conducted with a laser-exposing device having an inner drum system. For example, if one side of a negative-working PS plate is imagewise-exposed to a light through a solid image, a fog due to a bad developability is caused when the opposite side is a non-image area. When the opposite side (140 to 220° to the light source) is a dot area, the dot becomes widen. As the result, it is difficult to reproduce the small image or highlight portion.

SUMMARY OF THE INVENTION

The purpose of the present invention is to provide a method for making a lithographic printing plate which prevents fogging that is caused by a reflection of a light to give a clear image when the plate is imagewise-exposed to short wavelength laser using an inner drum-type laser exposing device.

The inventors of the present invention found that the method for making a lithographic printing plate, which comprises imagewise exposing a presensitized plate having a photopolymerizable layer on a substrate having a hydrophilic surface by scanning the plate with laser light having a wavelength of 450 nm or shorter, developing the exposed plate with a developer and further exposing the whole surface of the developed plate to light having a wavelength of 450 nm or shorter, provides a lithographic printing plate which prevents a fog of reflection that is easily occurred in an inner drum-type exposing device during a direct process to provide a clear image as well as a high printing durability.

BEST MODE FOR CARRYING OUT THE INVENTION

Hereinafter, embodiments of the present invention are described. The present invention provides a method for making a lithographic printing plate, which comprises imagewise exposing a presensitized plate having a photopolymerizable layer on a substrate having a hydrophilic surface by scanning the plate with laser light having a wavelength of 450 nm or shorter, developing the exposed plate with a developer and further exposing the whole surface of the developed plate to light having a wavelength of 450 nm or shorter.

(Laser Beam Having a Wavelength of 450 nm or Shorter for Scanning Exposure)

In the method of the present invention, the laser beam to be used should have wavelength of 450 nm or shorter. Examples of such laser beams are described below.

Examples of gas laser include Ar ion laser (364 nm, 351 nm, 10 mW to 1W), Kr ion laser (356 nm, 351 nm, 10 mW to 1 W), and He—Cd laser (441 nm, 325 nm, 1 mW to 100 mW). Examples of solid laser include a combination of Nd:YAG(YVO$_4$) and SHG crystal×2 times (355 nm, 5 mW to 1 W), and a combination of Cr:LiSAF and SHG crystal (430 nm, 10 mW).

Examples of semiconductor laser include a KNbO$_3$ ring resonator (430 nm, 30 mW), a combination of a waveguide-type wavelength conversion element and AlGaAs or InGaAs semiconductor laser (380 nm to 450 nm, 5 mW to 100 mW), a combination of a waveguide-type wavelength conversion element and AlGaInP or AlGaAs semiconductor laser (300 nm to 350 nm, 5 mW to 100 mW), AlGaInN (350 nm to 450 nm, 15 mW to 30 mW), and examples of pulse laser include $N_2$ laser (337 nm, pulse; 0.1 to 10 mJ) and XeF (351 nm, pulse; 10 to 250 mJ).

Among the lasers, AlGaInN semiconductor laser (commercially available InGaN-type semiconductor laser, 400 to 410 nm, and 5 to 30 mW) is preferable from the viewpoint of its wavelength property and cost.

The amount of light to be exposed during imagewise-exposure of the plate is preferably selected so that the light provides no flaring and gives a high resolution, depending on the components of the photopolymerizable composition to be used and other conditions. Usually, suitable amount of the light for imagewise-exposure ranges 0.01 mJ/cm$^2$ to 1 mJ/cm$^2$, and preferably from 0.02 mJ/cm$^2$ to 0.5 mJ/cm$^2$.

Exposing device for lithographic printing plate using a scanning exposing system includes an exposing apparatus of inner drum type, outer drum type or flat bed type. A preferred example of light source for the device includes a light source that can continuously oscillate. The following exposing device is particular preferred in view of the sensitivity of the PS plate and the process time.

Inner drum type exposing device with single beam to triple beams wherein at least one light source of gas laser or solid laser is used so that the total output of the semiconductor laser becomes 20 mW or higher Flat bed type exposing device with multiple beams (1 to 10) wherein at least one light source of a semiconductor laser, gas laser or solid laser so that the total output of the laser becomes 20 mW or higher Outer drum type exposing device with multiple beams (1 to 9) wherein at least one light source of a semiconductor laser, gas laser or solid laser so that the total output of the laser becomes 20 mW or higher Outer drum type exposing device with multiple beams (10 or more) wherein at least one light source of a semiconductor laser or solid laser so that the total output of the laser becomes 20 mW or higher The following relationship (eq 1) can be observed between the sensitivity of the PS plate (X J/cm$^2$), exposed area of the PS plate (S cm$^2$), a power of one laser light source (q W), the number of lasers (n) and the total exposing time (t s) in the lithographic printing plate that can be directly exposed to laser.

$$X \cdot S = n \cdot q \cdot t \quad \text{(eq 1)}$$

i) The following relationship (eq 2) can be observed between the winding number of the laser (f radian/s), secondary scanning length (Lx cm), resolution (Z dot/cm) and the total exposing time (t s) when inner drum type exposing device with single beam is used.

$$f \cdot Z \cdot t = Lx \quad \text{(eq 2)}$$

ii) The following relationship (eq 3) can be observed between the winding number of the drum (F radian/s), secondary scanning length (Lx cm), resolution (Z dot/cm), and the total exposing time (t s), the number of beam (n), when outer drum type exposing device with multiple beams is used.

$$F \cdot Z \cdot n \cdot t = Lx \quad \text{(eq 3)}$$

iii) The following relationship (eq 4) can be observed between the winding number of the polygonal mirror (H radian/s), secondary scanning length (Lx cm), resolution (Z dot/cm), the total exposing time (t s), and the number of beams (n), when a flat head (multiple beams) type exposing device is used.

$$F \cdot Z \cdot n \cdot t = Lx \quad \text{(eq 4)}$$

It can be understood that the combination of the laser of which total output is 20 mW or higher and multiple beams system is particularly preferred when the PS plate of the present invention is used by assigning the resolution (2560 dpi), the size of plate (A1/B1, secondary scanning length is 42 inch), the exposing rate (20 plates/1 hour) and the property of the photosensitive composition of the present invention (wavelength, sensitivity: about 0.1 mJ/cm$^2$) into the above equations. In addition, in view of the operability, cost and the like, the exposing device comprising an outer drum type semiconductor laser with multiple beams (10 or higher) is most preferred.

(Light Source for Exposing the Whole Surface of the Plate After Development)

The whole surface of the plate is exposed to light with the wavelength of 450 nm or shorter after the plate has been developed. Examples of light source include carbon arc light, mercury vapor lamp, metal halide, xenon lamp, and tungsten lamp.

Preferably, the light intensity for exposing the whole surface of the plate is 20 W/cm$^2$.

Preferably, the amount of light for exposing the whole surface of the plate is at least 100 times and more preferably 500 times greater than the amount of light used for imagewise-exposure. In order to obtain a sufficient printing durability, the amount of light for exposing the whole surface of the plate is at least 100 mJ/cm$^2$, more preferably 150 mJ/cm$^2$, and further preferably at least 200 mJ/cm$^2$.

The lithographic printing plate may be heated simultaneously with the exposure of the whole surface of the plate. The heating treatment improves the printing durability of the plate. Examples of the device for the heat treatment include a conventional convection oven, IR irradiation device, IR laser, microwave device, Wisconsin oven and the like. The temperature of the surface of the plate under heating condition is preferably in the range of 30° C. to 150° C., more preferably from 35° C. to 130° C. and further preferably from 40° C. to 120° C.

(Photosensitive Composition)

The photosensitive composition for photopolymerizable layer to be used in the method of the present invention comprises (A) a photopolymerization initiation system and (B) at least one compound of which physical or chemical property may be irreversibly changed upon contact with radical or acid, and optionally (C) a binder polymer. Hereinafter, each component will be explained.

(A) Photopolymerization Initiation System

The photopolymerization initiation system or initiator essentially comprised in the photosensitive composition for the photopolymerizable layer of the present invention preferably comprises (A1) a sensitizing dye having a specific structure mentioned below and (A2) a titanocene compound. It is believed that the sensitizing dye of the photopolymerization initiation system mainly absorbs light and the coexisting titanocene compound enhances the generation of initiation radical. Such a process is referred to as "dye sensitizing". A sensitizing dye preferably utilized in the present invention has an absorption wavelength ranging from 350 to 450 nm. Many of titanocene compounds described below have a weak absorption in the range of ultraviolet region to 500 nm and thus show photosensitivity in this range. However, the sensitizing dye having a specific structure preferably utilized in the present invention markedly improves the photosensitivity of the titanocene compound. Therefore, it may be possible to lower the photosensitivity at around 500 nm caused by titanocene compound without lowering the photosensitivity at short wavelength by reducing the amount of titanocene compound to result in improvement of safelight suitability.

The sensitizing dye in the present invention preferably has the structural characteristics described below since such a sensitizing dye may have the properties described above. That is, if the acidic nucleus of the sensitizing dye has a 5-membered oxazolidinone ring having at least one carbonyl group or thiocarbonyl group and the basic nucleus has an aromatic ring or heterocyclic ring, the dye shows particularly high sensitivity and good absorption property. The definition of "acidic nucleus" and "basic nucleus" are described in T. H. James, "The Theory of The Photographic Process" fourth edition, Macmillan, chapter 8.

The sensitizing dyes represented by merocyanine dye generally comprise 1) basic (electron-donating) and 2) acidic (electron-accepting) heterocyclic ring at the end of the molecule. The basic (electron-donating) heterocyclic ring is referred to as basic nucleus and the acidic (electron-accepting) heterocyclic ring is referred to as acidic nucleus. The examples of acidic nucleus and basic nucleus are described in T. H. James, "The Theory of The Photographic Process" fourth edition, Macmillan, chapter 8.

The reason why the sensitizing dyes having such specific structures are excellent in the dye sensitizing ability is not clear since the mechanism of the dye sensitizing is unknown. But the reason may be rationalized as follows. That is, the sensitizing dyes described above show very strong emission (fluorescent or phosphorescence) spectrum. It may be observed from the fact that the lifetime of the excited states of the sensitizing dyes having the partial structures described above is relatively long and thus, the dyes may affect the reaction with an activating agent so that it becomes efficient.

(A1) Sensitizing Dye

The sensitizing dyes represented by the following general formula (1) are preferred.

(1)

In general formula (1), A represents an optionally substituted aromatic ring or heterocyclic ring, X represents oxygen atom, sulfur atom or —N($R_3$)—, $R_1$, $R_2$ and $R_3$ each independently represents hydrogen atom or monovalent nonmetallic atom group and A and $R_1$, or $R_2$ and $R_3$ can be linked together to form an aliphatic or an aromatic ring.

More specifically, in general formula (1), $R_1$, $R_2$ and $R_3$ each independently represents hydrogen atom or monovalent nonmetallic atom group and preferably substituted or unsubstituted alkyl group, substituted or unsubstituted alkenyl group, substituted or unsubstituted aryl group, substituted or unsubstituted heteroaromatic ring residue, substituted or unsubstituted alkoxy group, substituted or unsubstituted alkylthio group, hydroxyl group, halogen atoms.

Preferred examples of $R_1$, $R_2$ and $R_3$ are described below. Preferred examples of alkyl group include a linear, branched and cyclic alkyl group with 1 to 20 carbon atoms such as methyl group, ethyl group, propyl group, butyl group, pentyl group, hexyl group, heptyl group, octyl group, nonyl group, decyl group, undecyl group, dodecyl group, tridecyl group, hexadecyl group, octadecyl group, eicosyl group, isopropyl group, isobutyl group, s-butyl group, t-butyl group, isopentyl group, neopentyl group, 1-methylbutyl group, isohexyl group, 2-ethylhexyl group, 2-methylhexyl group, cyclohexyl group, cyclopentyl group, and 2-norbornyl group. Among the groups, preferred groups are linear alkyl group with 1 to 12 carbon atoms, a branched alkyl group with 3 to 12 carbon atoms and a cyclic alkyl group with 5 to 10 carbon atoms.

An example of the substituent on the alkyl group includes monovalent nonmetallic atom group except for hydrogen atom. Preferred examples of such a group include halogen atoms (—F, —Br, —Cl, —I), hydroxyl group, alkoxy group, aryloxy group, mercapto group, alkylthio group, arylthio group, alkyldithio group, aryldithio group, amino group, N-alkylamino group, N,N-dialkylamino group, N-arylamino group, N,N-diarylamino group, N-alkyl-N-arylamino group, acyloxy group, carbamoyloxy group, N-alkylcarbamoyloxy group, N-arylcarbamoyloxy group, N,N-dialkylcarbamoyloxy group, N,N-diarylcarbamoyloxy group, N-alkyl-N-arylcarbamoyloxy group, alkylsulfoxy group, arylsulfoxy group, acylthio group, acylamino group, N-alkylacylamino group, N-arylacylamino group, ureido group, N'-alkylureido group, N',N'-dialkylureido group, N'-arylureido group, N',N'-diarylureido group, N'-alkyl-N'-arylureido group, N-alkylureido group, N-arylureido group, N'-alkyl-N-alkylureido group, N'-alkyl-N-arylureido group, N',N'-dialkyl-N-alkylureido group, N',N'-dialkyl-N-arylureido group, N'-aryl-N-alkylureido group, N'-aryl-N-arylureido group, N',N'-diaryl-N-alkylureido group, N',N'-diaryl-N-arylureido group, N'-alkyl-N'-aryl-N-alkylureido group, N'-alkyl-N'-aryl-N-arylureido group, alkoxycarbonylamino group, aryloxycarbonylamino group, N-alkyl-N-alkoxycarbonylamino group, N-alkyl-N-aryloxycarbonylamino group, N-aryl-N-alkoxycarbonylamino group, N-aryl-N-aryloxycarbonylamino group, formyl group, acyl group, carboxyl group, alkoxycarbonyl group, aryloxycarbonyl group, carbamoyl group, N-alkylcarbamoyl group, N,N-dialkylcarbamoyl group, N-arylcarbamoyl group, N,N-diarylcarbamoyl group, N-alkyl-N-arylcarbamoyl group, alkylsulfinyl group, arylsulfinyl group, alkylsulfonyl group, arylsulfonyl group, sulfo group (sulfonic group) (—$SO_3H$) and conjugate base group thereof (hereinafter, referred to as sulfonate group), alkoxysulfonyl group, aryloxysulfonyl group, sulfinamoyl group, N-alkylsulfinamoyl group, N,N-dialkylsulfinamoyl group, N-arylsulfinamoyl group, N,N-diarylsulfinamoyl group, N-alkyl-N-arylsulfinamoyl group, sulfamoyl group, N-alkylsulfamoyl group, N,N-dialkylsulfamoyl group, N-arylsulfamoyl group, N,N-diarylsulfamoyl group, N-alkyl-N-arylsulfamoyl group, phosphono group (—$PO_3H_2$) and conjugate base group thereof (hereinafter, referred to as phosphonate group), dialkylphosphono group (—$PO_3(alkyl)_2$), diarylphosphono group (—$PO_3(aryl)_2$), alkylarylphosphono group (—$PO_3(alkyl)(aryl)$), monoalkylphosphono group (—$PO_3H(alkyl)$) and conjugate base group thereof (hereinafter, referred to as alkylphosphonate group), monoarylphosphono group (—$PO_3H(aryl)$) and conjugate base group thereof (hereinafter, referred to as arylphosphonate group), phosphonoxy group (—$OPO_3H_2$) and conjugate base group thereof (hereinafter, referred to as phosphonato-oxy group), dialkylphosphonoxy group (—$OPO_3(alkyl)_2$), diarylphosphonoxy group (—$OPO_3(aryl)_2$), alkylarylphosphonoxy group (—$OPO_3(alkyl)(aryl)$), monoalkylphosphonoxy group (—OPO₃H(alkyl)) and conjugate base group thereof (hereinafter, referred to as alkylphosphonato-oxy group), monoarylphosphonoxy group (—OPO₃H(aryl)) and conjugate base group thereof (hereinafter, referred to as arylphosphonato-oxy group), cyano group, nitro group, aryl group, heteroaryl group, alkenyl group, and alkynyl group.

Specific examples of alkyl group in the substituents are as described for alkyl group described above, and specific examples of aryl group in the substituents include phenyl group, biphenyl group, naphthyl group, tolyl group, xylyl group, mesityl group, cumenyl group, chlorophenyl group, bromophenyl group, chloromethylphenyl group, hydroxyphenyl group, methoxyphenyl group, ethoxyphenyl group, phenoxyphenyl group, acetoxyphenyl group, benzoyloxyphenyl group, methylthiophenyl group, phenylthiophenyl group, methylaminophenyl group, dimethylaminophenyl group, acetylaminophenyl group, carboxyphenyl group, methoxycarbonylphenyl group, ethoxyphenylcarbonyl group, phenoxycarbonylphenyl group, N-phenylcarbamoylphenyl group, phenyl group, cyanophenyl group, sulfophenyl group, sulfonatophenyl group, phosphonophenyl group, phosphonatophenyl group and the like.

Specific examples of heteroaryl group include a monocyclic ring comprising at least one atom selected from nitrogen, oxygen, and sulfur atoms, or polycyclic aromatic ring in which heteroaryl group such as thiophene, thianthrene, furan, pyran, isobenzofuran, chromene, xanthene, phenoxazine, pyrrole, pyrazole, isothiazole, isooxazole, pyrazine, pyrimidine, pyridazine, indolizine, isoindolizine, indole, indazole, purine, quinolizine, isoquinoline, phthalazine, naphthyridine, quinazoline, cinnoline, pteridine, carbazole, carboline, phenanthrene, acridine, perimidine, phenanthroline, phenarsazine, phenoxazine, furazan, and the like are preferred. These groups may be a condensed ring with benzene or may have a substituent.

Specific examples of alkenyl group include vinyl group, 1-propenyl group, 1-butenyl group, cinnamyl group, 2-chloro-1-ethenyl group, and the like. Examples of alkynyl group include ethynyl group, 1-propynyl group, 1-butynyl group, trimethylsilylethynyl group and the like. Examples of acyl group include G₁CO— wherein G₁ is hydrogen atom and alkyl group or aryl group described above. More preferable substituents are halogen atoms (—F, —Br, —Cl, —I), alkoxy group, aryloxy group, alkylthio group, arylthio group, N-alkylamino group, N,N-dialkylamino group, acyloxy group, N-alkylcarbamoyloxy group, N-arylcarbamoyloxy group, acylamino group, formyl group, acyl group, carboxyl group, alkoxycarbonyl group, aryloxycarbonyl group, carbamoyl group, N-alkylcarbamoyl group, N,N-dialkylcarbamoyl group, N-arylcarbamoyl group, N-alkyl-N-arylcarbamoyl group, sulfo group (sulfonic group), sulfonate group, sulfamoyl group, N-alkylsulfamoyl group, N,N-dialkylsulfamoyl group, N-arylsulfamoyl group, N-alkyl-N-arylsulfamoyl group, phosphono group, phosphonate group, dialkylphosphono group, diarylphosphono group, monoalkylphosphono group, alkylphosphonate group, monoarylphosphono group, arylphosphonate group, phosphonoxy group, phosphonato-oxy group, aryl group, and alkenyl group.

Alkylene group in the substituted alkyl group is a bivalent organic residue group derived from alkyl group having 1 to 20 carbon atoms described above by removing one hydrogen atom on the alkyl group and preferably a linear alkylene group having 1 to 12 carbon atoms, a branched alkylene group having 3 to 12 carbon atoms or a cyclic group having 5 to 10 carbon atoms.

Preferred examples of substituted alkyl group as $R_1$, $R_2$ and $R_3$, a combination of substituent and alkylene group, include chloromethyl group, bromomethyl group, 2-chloroethyl group, trifluoromethyl group, methoxymethyl group, methoxyethoxyethyl group, allyloxymethyl group, phenoxymethyl group, methylthiomethyl group, tolylthiomethyl group, ethylaminoethyl group, diethylaminopropyl group, morpholinopropyl group, acetyloxymethyl group, benzyloxymethyl group, N-cyclohexylcarbamoyloxyethyl group, N-phenylcarbamoyloxyethyl group, acetylaminoethyl group, N-methylbenzoylaminopropyl group, 2-oxyethyl group, 2-oxopropyl group, carboxypropyl group, methoxycarbonylethyl group, allyloxycarbonylbutyl group, chlorophenoxycarbonylmethyl group, carbamoylmethyl group, N-methylcarbamoylethyl group, N,N-dipropylcarbamoylmethyl group, N-(methoxyphenyl)carbamoylethyl group, N-methyl-N-(sulfophenyl)carbamoylmethyl group, sulfobutyl group, sulfonatobutyl group, sulfamoylbutyl group, N-ethylsulfamoylmethyl group, N,N-dipropylsulfamoylpropyl group, N-tolylsulfamoylpropyl group, N-methyl-N-(phosphonophenyl)sulfamoyloctyl group, phosphonobutyl group, phosphonatohexyl group, diethylphosphonobutyl group, diphenylphosphonopropyl group, methylphosphonobutyl group, methylphosphonatobutyl group, tolylphosphonohexyl group, tolylphosphonatohexyl group, phosphonooxypropyl group, phosphonatooxybutyl group, benzyl group, phenethyl group, α-methylbenzyl group, 1-methyl-1-phenylethyl group, p-methylbenzyl group, cinnamyl group, allyl group, 1-propenylmethyl group, 2-butenyl group, 2-methylallyl group, 2-methylpropenylmethyl group, 2-propynyl group, 2-butynyl group, 3-butynyl group and the like.

Preferred examples of aryl group as $R_1$, $R_2$ and $R_3$ include a fused ring consisting of 1 to 3 benzene rings and a fused ring consisting of benzene ring and 5-membered unsaturated ring. More specific examples thereof include phenyl group, naphthyl group, anthryl group, phenanthryl group, indenyl group, acenaphthenyl group, and fluorenyl group. Among the groups, phenyl and naphthyl groups are more preferred.

Preferred examples of substituted aryl group as $R_1$, $R_2$ and $R_3$ include those having a monovalent non-metallic atom group except for hydrogen atom as a substituent on the carbon atom of aryl group described above. Preferred examples of substituents include alkyl group and substituted alkyl group described above as well as aforementioned substituents as described for substituted alkyl group. Preferred examples of substituted aryl group include biphenyl group, tolyl group, xylyl group, mesityl group, cumenyl group, chlorophenyl group, bromophenyl group, fluorophenyl group, chloromethylphenyl group, trifluoromethylphenyl group, hydroxyphenyl group, methoxyphenyl group, methoxyethoxyphenyl group, allyloxyphenyl group, phenoxyphenyl group, methylthiophenyl group, tolylthiophenyl group, ethylaminophenyl group, diethylaminophenyl group, morpholinophenyl group, acetyloxyphenyl group, benzyloxyphenyl group, N-cyclohexylcarbamoyloxyphenyl group, N-phenylcarbamoyloxyphenyl group, acetylaminophenyl group, N-methylbenzoylaminophenyl group, carboxyphenyl group, methoxycarbonylphenyl group, allyloxycarbonylphenyl group, chlorophenoxycarbonylphenyl group, carbamoylphenyl group, N-methylcarbamoylphenyl group, N,N-dipropylcarbamoylphenyl group, N-(methoxyphenyl)carbamoylphenyl group, N-methyl-N-(sulfophenyl)carbamoylphenyl group, sulfophenyl group, sulfonatophenyl group, sulfamoylphenyl group, N-ethylsulfamoylphenyl group, N,N-dipropylsulfamoylphenyl group, N-tolylsulfamoylphenyl group, N-methyl-N-(phosphonophenyl)sulfamoylphenyl group, phosphonophenyl group, phosphonatophenyl group, diethylphosphonophenyl group, diphenylphosphonophenyl group, methylphosphonophenyl group, methylphosphonatophenyl group, tolylphosphonophenyl group, tolylphosphonatophenyl group, allyl group, 1-propenylmethyl group, 2-butenyl group, 2-methylallylphenyl group, 2-methylpropenylphenyl group, 2-propynylphenyl group, 2-butynylphenyl group, 3-butynylphenyl group and the like.

The symbol A in the general formula (1) is explained below. A represents an optionally substituted aromatic ring or heterocyclic ring. Examples of the optionally substituted aromatic ring or heterocyclic ring include the same groups as explained for $R_1$, $R_2$ and $R_3$ in the general formula (1).

The sensitizing dye represented by the general formula may be obtained by a condensation reaction of the acidic nucleus described above or acidic nucleus having active methylene group with a substituted or unsubstituted aromatic ring or heterocyclic ring. The dyes may be prepared in accordance with the description in Japanese Patent Publication for Opposition Purpose (hereunder referred to as "J.P. KOKOKU") No. Sho 59-28329. Specific examples of the compound of general formula (1), (D1) to (D28) are described below, but not limited thereto. In addition, regioisomers regarding the double bond which connects the acidic nucleus and basic nucleus in the sensitizing dye are not determined and therefore, the sensitizing dye in the present invention is not limited to one of the isomers but include both the isomers.

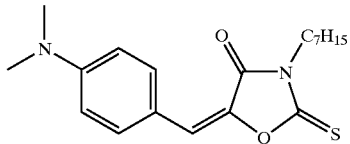
(D1)

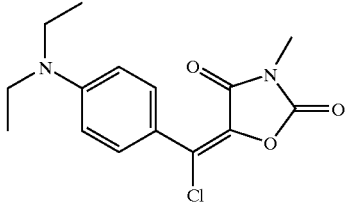
(D2)

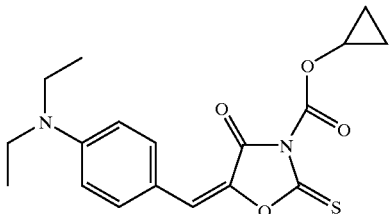
(D3)

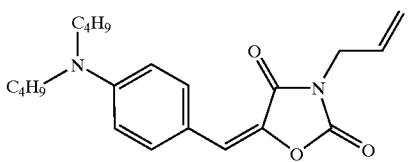
(D4)

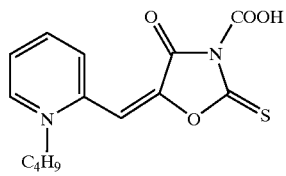
(D5)

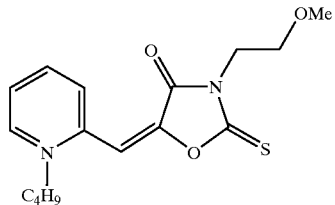
(D6)

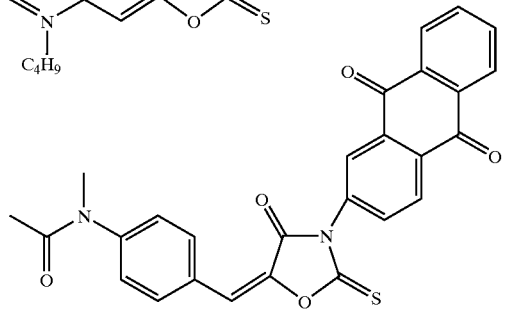
(D7)

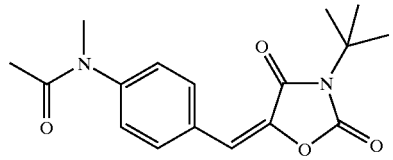
(D8)

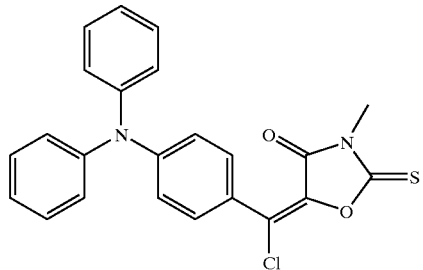
(D9)

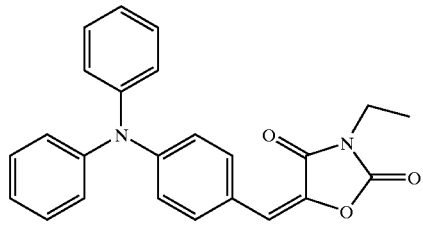
(D10)

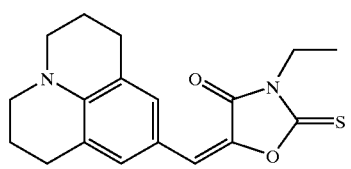
(D11)

(D12) 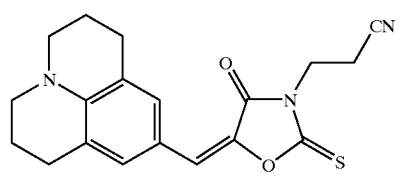
(D13) 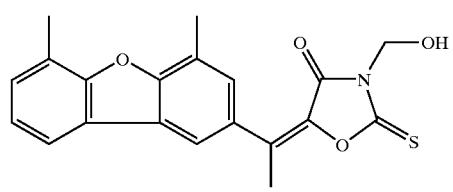
(D14) 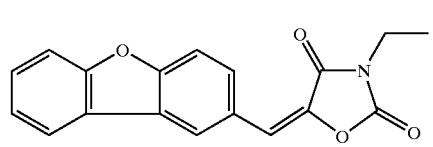
(D15) 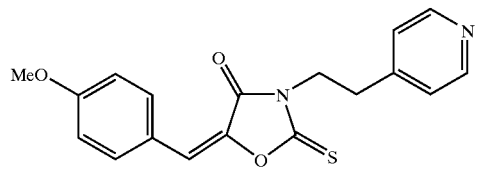
(D16) 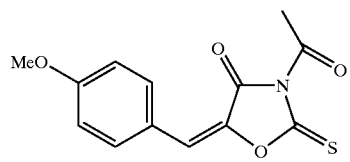
(D17) 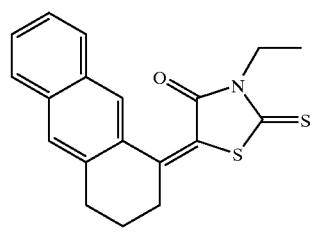
(D18) 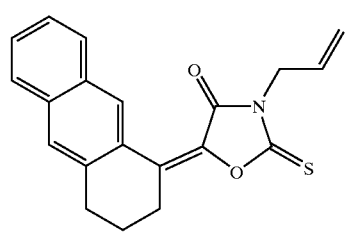
(D19) 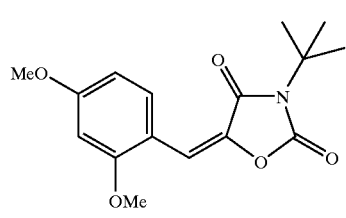
(D20) 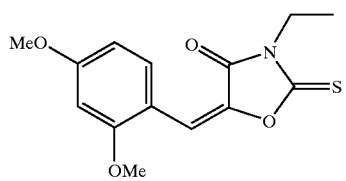
(D21) 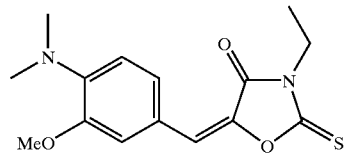
(D22) 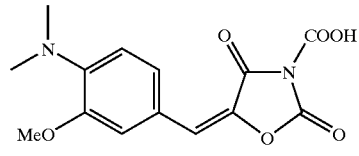
(D23) 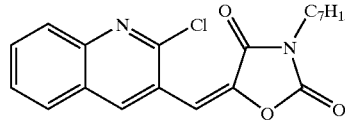
(D24) 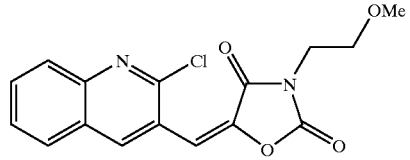
(D25) 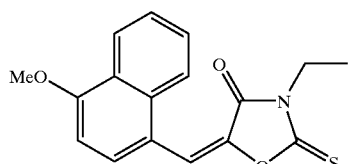
(D26) 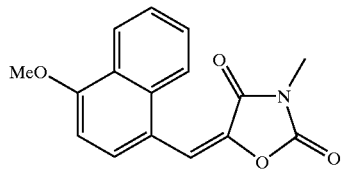
(D27) 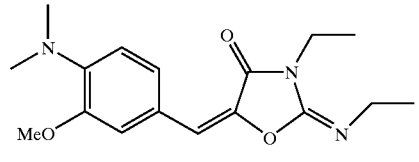
(D28) 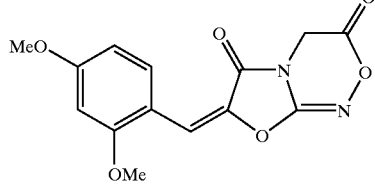
The sensitizing dyes used in the present invention may be modified to improve the properties of the photosensitive layer in the PS plate. For example, the sensitizing dye can be connected with an addition polymerization group such as acryloyl group and methacryloyl group by means of a covalent bond, ionic bond, hydrogen bond and the like to improve the hardness of the exposed layer or to inhibit the precipitation of the pigment. In addition, it may be possible to significantly increase the photosensitivity of the layer especially in the presence of low content of photoinitiation system by connecting the sensitizing dye with the titanocene compound described below or radical generation group of other compounds, for example, a group which decomposes by reduction such as halogenized alkyl, onium, peroxide, biimidazole, onium, biimidazole and the like, or a group which decomposes by oxidation such as borate, amine, trimethylsilylmethyl, carboxymethyl, carbonyl, imine and the like.

In addition, in order to improve the adaptability of the photosensitive composition to an alkaline aqueous developer, it is effective to introduce a hydrophilic group, e.g., acid group or polar group such as carboxyl group and ester thereof, sulfonic acid group and ester thereof, ethylene oxide group and the like. In particular, hydrophilic group such as ester type group shows good compatibility because the group is relatively hydrophobic in the photosensitive layer and the group may be hydrolyzed in a developer to produce an acidic group to result in increase of the hydrophilicity of the molecule. In addition, other substituents which improve the compatibility in the photosensitive layer or which inhibit the precipitation of crystalline can be introduced into the molecule. For example, an unsaturated bonding group such as an aryl group and allyl group is effective for improving the compatibility in a specific photosensitive system. Also, the precipitation of the crystal can be significantly inhibited by introducing a branched alkyl structure to give a steric hindrance between π planes of the dye. Also, it may be possible to improve the adherence to inorganic material such as metal or metal oxide by introducing phosphonic acid group, epoxy group, trialkoxysilyl group and etc. In addition, polymerization of sensitizing dye can be also utilized.

The details of the condition for use of the dye, e.g., the structure of the sensitizing dye to be used, single use or combination use, and the amount of the dye, can be suitably determined in accordance with the performance of the PS plate to be used. For example, it may be possible to increase the compatibility of the sensitizing dye to the photosensitive composition layer by combining two or more of sensitizing dyes. In the selection of the sensitizing dye, most important factor is the molar extinction coefficient thereof under the radiation wavelength of the light source to be used, in addition to the photosensitivity. If a dye having a high molar extinction coefficient is used, the amount of the dye to be used can be relatively reduced to give economical advantages. In addition, such a dye is advantageous when it is used in a photosensitive layer for a PS plate because of the physical property of the layer. The photosensitivity and resolution property of the photosensitive layer or the physical property of the irradiated layer may be influenced by the absorbency at the wavelength of the light source. Therefore, the amount of the sensitizing dye should be determined taking these facts into account. For example, the sensitivity of the dye may decrease if the absorbency becomes 0.1 or lower. In addition, the sensitizing dye may be influenced by halation to result in low resolution.

However, when a thick film having a thickness of 5 µm or more is made, sometimes a sensitizing dye having such a low absorbency can increase the degree of the hardening. In another case, if the absorbency is so high (3 or higher), most of the light is absorbed at the upper portion of the photosensitive layer to inhibit the inside hardening to result in insufficient strength of film and adherence to the substrate when used as a printing plate. When a lithographic printing plate having a relatively thin film is used, it is preferably to use a sensitizing dye so that the absorbency of the photosensitive layer becomes in the range of 0.1 to 1.5 and more preferably in the range of 0.25 to 1. The amount of sensitizing dye is generally used in the range of 0.05 to 30 parts by weight based on 100 parts by weight of the components of the photosensitive layer, preferably from 0.1 to 20 parts by weight, and more preferably from 0.2 to 10 parts by weight.

(A2) Titanocene Compound

The photopolymerization initiation system preferably comprises a titanocene compound which generates active radical when it is exposed to light in the presence of sensitizing dye. A suitable titanocene compound can be selected from various titanocene compounds including, for example, those described in J.P. KOKAI No. Sho 59-152396, J.P. KOKAI No. Sho 61-151197, J.P. KOKAI No. Sho 63-41483, J.P. KOKAI No. Sho 63-41484, J.P. KOKAI No. Hei 2-249, J.P. KOKAI No. Hei 2-291, J.P. KOKAI No. Hei 3-27393, J.P. KOKAI No. Hei 3-12403, and J.P. KOKAI No. Hei 6-41170.

More specifically, examples of titanocene compound include di-cyclopentadienyl-Ti-di-chloride, di-cyclopentadienyl-Ti-bis-phenyl, di-cyclopentadienyl-Ti-bis-2,3,4,5,6-pentafluorophen-1-yl (hereinafter, referred to as "T-1"), di-cyclopentadienyl-Ti-bis-2,3,5,6-tetrafluorophen-1-yl, di-cyclopentadienyl-Ti-bis-2,4,6-trifluorophen-1-yl, di-cyclopentadienyl-Ti-bis-2,6-difluorophen-1-yl, di-cyclopentadienyl-Ti-bis-2,4-difluorophen-1-yl, di-methylcyclopentadienyl-Ti-bis-2,3,4,5,6-pentafluorophen-1-yl, di-methylcyclopentadienyl-Ti-bis-2,3,5,6-tetrafluorophen-1-yl, di-methylcyclopentadienyl-Ti-bis-2,4-difluorophen-1-yl, bis(cyclopentadienyl)-bis(2,6-difluoro-3-(pyr-1-yl)phenyl) titanium (hereinafter, referred to as "T-2".) and the like.

It is also possible to modify the titanocene compounds to improve the property of the photosensitive layer comprising the compounds as described for the sensitizing dyes. For example, the compounds can be modified by binding with an addition polymerizable unsaturated compound or a radical-generating group of other compounds, introducing a hydrophilic group, introducing a substitution group to improve compatibility of the or to inhibit the precipitation of crystals, introducing a substitution group to improve the adherence of the layer The condition of the titanocene compounds to be used can be suitably determined in accordance with the purpose of the photosensitive layer, as described for the addition polymerizable compound and sensitizing dyes. For example, it may be possible to increase the compatibility of the compound to the photosensitive layer by combining two or more of the compounds. Usually, it is advantageous for the photosensitivity of the photosensitive layer to use a relatively large amount of the titanocene compound. Generally, the photosensitivity of the photosensitive layer may be enough when 0.5 to 80 parts by weight and preferably 1 to 50 parts by weight of titanocene compound on the basis of 100 parts by weight of the total amount of photosensitive layer. However, it is preferred to use a relatively low amount of titanocene compound when the PS plate is used under yellow or white light since fog is caused by the light with wavelength of 500 nm. In such a case, the titanocene compound can be used in a combination with the sensitizing dye described above. As the result, a sufficient photosensitivity can be obtained even if the amount of titanocene compound is 6 parts by weight or less. In another embodiment, the amount of the titanocene compound may be 1.9 parts by weight or less, and further 1.4 parts by weight or less.

(B) A Compound of which Physical or Chemical Property is Irreversibly Changed Upon Contact with Radical or Acid The second component of the photosensitive layer in the present invention is a compound of which physical or chemical property is irreversibly changed by action of active species which is produced from the photoreaction of the photoinitiation system described above. That is, physical or chemical property of the compound is changed upon contact with active species such as radical, acid and the like and the changed property of the compound is retained. Any compound can be used as component (B) as long as the compound has such properties. For example, the compounds described as those in the photoinitiation system often have such properties. Examples of the property of the compound, which is changed by the action of the radical, acid and/or base include physical properties of molecules such as absorption spectral (color), chemical structure and polarizability as well as physical properties of materials such as solubility, strength, flexibility, mobility, viscosity and the like.

For example, when a compound of which absorption spectral is changed in accordance with the change of pH, e.g., a pH indicator, is used as a component (B) and acid or base is generated from a photoinitiation system, the color of the irradiated portion of the photosensitive composition can be changed. Such a composition is useful as an image-forming composition. Likewise, when a compound of which absorption spectral is changed by oxidation, reduction or nucleophilic addition reaction is used and a radical is produced from photoinitiation system to cause oxidation, reduction and the like, it is also possible to form an image. Such examples are disclosed in, for example, J. Am. Chem. Soc., 108, 128 (1986), J. Imaging. Sci., 30, 215 (1986), and Israel. J. Chem., 25, 264 (1986).

In addition, when a compound that can be addition polymerized or polycondensed is used as a component (B) in a combination with a photoinitiation system, it may be possible to form a photocoagulation resin or negative working photopolymer. Examples of component (B) include radical polymerizable compound (a compound having an ethylenically unsaturated bond), cation polymerizable compound (epoxy compound, vinyl ether compound, methylol compound and the like), and anion polymerizable compound (epoxy compound and the like) and those as described in, for example, "Photopolymer Handbook", edited by photopolymer konwakai, by Kogyotyosakai (1989) or "Polymer", 45, 786 (1996). In addition, a composition comprising a thiol compound as component (B) and a radical-generating system by light is well known.

It is also useful to use an acidolytic compound in a combination with acid-generating agent by light. For example, a polymer having a side chain or main chain that decomposes by acid can be used as a material that is changed in its solubility, hydrophilicity or hydrophobicity. Such materials are widely used as photodegradable photosensitive resin or positive working photopolymer. Specific examples of the compound include those described in, for example, ACS. Symp. Ser., 242, 11(1984), J.P. KOKAI No. Sho 60-3625, U.S. Pat. Nos. 5,102,771, 5,206,317, and 5,212,047, J.P. KOKAI No. Hei 4-26850, J.P. KOKAI No. Hei 3-1921731, J.P. KOKAI No. Sho 60-10247, and J.P. KOKAI No. Sho 62-40450.

Hereinafter, the addition polymerizable compound that is used as component (B) in the PS plate of the present invention are described.

(B1) Addition Polymerizable Compound

An addition polymerizable compound having at least one ethylenically unsaturated double bond, component (B1), used in the present invention is preferably selected from addition polymerizable compounds having at least one or two ethylenically unsaturated double bond terminally. Such compounds are well known in the art and any known compound can be utilized in the present invention. The compound may be in the form of a monomer, prepolymer such as dimer, trimer and oligomer, or a mixture thereof as well as a copolymer. Examples of the monomer and copolymer thereof include unsaturated carboxylic acid (for example, acrylic acid, methacrylic acid, itaconic acid, crotonic acid, isocrotonic acid, maleic acid and the like) or esters and amides thereof, and preferably, esters of unsaturated carboxylic acid and aliphatic polyalcohol compound, and amides of unsaturated carboxylic acid and aliphatic polyamine compound. In addition, an addition product of unsaturated carboxylate or amide having a nucleophilic substituent such as hydroxyl group, amino group, mercapto group and the like with mono- or polyfunctional isocyanate or epoxy group, and condensation reaction product of mono- or polyfunctional carboxylic acid can be preferably used.

Also, the following compounds are preferred; a product of an addition reaction of unsaturated carboxylic acid ester or amides having an isoelectronic substituent such as isocyanate group and epoxy group with monofunctional or polyfunctional alcohols, amines, thiols; and a product of a substitution reaction of unsaturated carboxylic acid ester or amides having a eliminative substituent such as halogen group and tosyloxy group with monofunctional or polyfunctional alcohols, amines and thiols. In another embodiments, compounds having unsaturated phosphonic acid, styrene, vinyl or ether group in place of the unsaturated carboxylic acid group in the above compounds may be used.

Examples of ester monomer of aliphatic polyalcohol and unsaturated carboxylic acid include acrylic acid ester such as ethyleneglycol diacrylate, triethyleneglycol diacrylate, 1,3-butanediol diacrylate, tetramethyleneglycol diacrylate, propyleneglycol diacrylate, neopentylglycol diacrylate, trimethylolpropane triacrylate, trimethylolpropane tri (acryloyloxypropyl) ether, trimethylolethane triacrylate, hexanediol diacrylate, 1,4-cyclohexanediol diacrylate, tetraethyleneglycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanulate isocyanurate, polyester acrylate oligomer and the like.

Examples of methacrylic acid ester include tetramethyleneglycol dimethacrylate, triethyleneglycol dimethacrylate, neopentylglycol dimethacrylate, trimethylolpropane trimethacrylate, trimethylolethane trimethacrylate, ethyleneglycol dimethacrylate, 1,3-butanediol dimethacrylate, hexanediol dimethacrylate, pentaerythritol dimethacrylate, pentaerythritol trimethacrylate, pentaerythritol tetramethacrylate, dip entaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, bis-[p-(methacryloxyethoxy)phenyl]dimethylmethane and the like.

Examples of itaconic acid ester include ethyleneglycol diitaconate, propyleneglycol diitaconate, 1,3-butanediol diitaconate, 1,4-butanediol diitaconate, tetramethyleneglycol diitaconate, pentaerythritol diitaconate, sorbitol tetraitaconate and the like.

Examples of crotonic acid ester include ethyleneglycol dicrotonate, tetramethyleneglycol dicrotonate, pentaerythritol dicrotonate, sorbitol tetradicrotonate and the like.

Examples of isocrotonic acid ester include ethyleneglycol diisocrotonate, pentaerythritol diisocrotonate, sorbitol tetraisocrotonate and the like.

Examples of maleic acid ester include ethyleneglycol dimaleate, triethyleneglycol dimaleate, pentaerythritol dimaleate, sorbitol tetramaleate and the like.

Other preferred examples of the esters include aliphatic and alcoholic esters as described in J.P. KOKOKU No. Sho 46-27926, J.P. KOKOKU No. Sho 51-47334, and J.P. KOKAI No. Sho 57-196231, esters with aromatic skeleton as described in J.P. KOKAI No. Sho 59-5240, J.P. KOKAI No. Sho 59-5241, and J.P. KOKAI No. Hei 2-226149, and esters with amino group as described in J.P. KOKAI No. Hei 1-165613. In addition, ester monomers described above can be used as a mixture.

Specific examples of amide monomer of aliphatic polyamine compound and unsaturated carboxylic acid include methylenebis-acrylamide, methylenebis-methacrylamide, 1,6-hexamethylenebis-acrylamide, 1,6-hexamethylenebis-methacrylamide, diethylenetriamine trisacrylamide, xylylenebisacrylamide, xylylenebis-methacrylamide and the like.

Another preferred example of the amide monomer includes that having a cyclohexylene structure as described in J.P. KOKOKU No. Sho 54-21726.

In addition, a urethane-type addition polymerizable compound that is prepared by addition reaction of isocyanate group and hydroxy group is also preferred. An example thereof includes vinylurethane compound comprising two or more polymerizable vinyl groups in a molecule, prepared by an addition reaction of a vinyl monomer having a hydroxyl group represented by the following formula (2) with a polyisocyanate compound having two or more isocyanate groups as disclosed in Japanese Patent Publication for Opposition Purpose (hereunder referred to as "J.P. KOKOKU") No. Sho 48-41708.

$$CH_2=C(R)COOCH_2CH(R')OH \qquad (2)$$

wherein R and R' each represents H or $CH_3$.

Also, urethane acrylates as described in J.P. KOKAI No. Sho 51-37193, J.P. KOKOKU No. Hei 2-32293, and J.P. KOKOKU No. Hei 2-16765, or urethane compounds having a skeleton of ethylene oxide as described in J.P. KOKOKU No. Sho 58-49860, J.P. KOKOKU No. Sho 56-17654, J.P. KOKOKU No. Sho 62-39417, and J.P. KOKOKU No. Sho 62-39418 is preferably used in the present invention.

In addition, it is possible to obtain a photosensitive composition which can be exposed at high speed by adding an addition polymerizable compounds having an amino structure or sulfide structure in a molecule as described in J.P. KOKAI No. Sho 63-277653, J.P. KOKAI No. Sho 63-260909, and J.P. KOKAI No. Hei 1-105238.

Other examples include polyfunctional acrylates or methacrylates such as epoxyacrylate prepared from epoxy resin and (meth)acrylic acid, and polyester acrylates as described in J.P. KOKAI No. Sho 48-64183, J.P. KOKOKU No. Sho 49-43191, and J.P. KOKOKU No. Sho 52-30490, can be utilized as the compound comprising an ethylenically unsaturated bond. In addition, the specific unsaturated compounds as described in J.P. KOKOKU No. Sho 46-43946, J.P. KOKOKU No. Hei 1-40337, J.P. KOKOKU No. and Hei 1-40336, or vinyl phosphonic acid compound as disclosed in J.P. KOKAI No. Hei 2-25493 are included. In other case, a compound having a perfluoroalkyl group as disclosed in J.P. KOKAI No. Sho 61-22048 can be suitably utilized. In addition, the photocoagulation monomer or oligomer as disclosed in the Bulletin of Japan Adhesion Association (Nihon Settyaku Kyoukai-si) vol. 20, No. 7, pages 300 to 308 (1984).

The details of the condition for the method, e.g., the structure of the compound to be used, single use or combination use, and the amount thereof, can be suitably determined in accordance with the performance of the PS plate to be used. For example, the compound can be selected in the light of the following points. A compound having more unsaturated groups in a molecule is preferred because such a compound is good in exposing speed. In many cases, a compound having two or more groups is preferred. In order to increase the strength of an image area, that is, a cured portion of the film, a compound having three or more groups is preferred. In addition, both the sensitivity and the strength of the layer may be controlled by combining an additional compound having a different number of the functional group or a different polymerizable group such as acrylic acid ester, methacrylic acid ester, styrene compound, and vinyl ether compound with the foregoing compound. A compound having a high molecular weight or a compound showing a high hydrophobicity is good in exposing speed or in the strength of the film, but in some cases, such a compound is not preferred because the developing speed may not be preferred and it may precipitate in a developer.

A selection of an addition polymerizable compound or usage thereof is very important parameter for the compatibility and dispersibility in the other components in the photosensitive composition such as a binder polymer, initiator, coloring agent and the like. For example, in some cases, use of a low-grade compound or a combination use of two or more of compounds can increase compatibility.

When a PS plate is prepared, it is possible to select a specific structure of the addition polymerizable compound to improve the adhesion of the substrate and overcoating layer. With regard to the ratio of addition polymerizable compound to the photosensitive composition, a higher ratio is advantageous for the sensitivity of the photosensitive composition. But sometimes, such a higher ratio raises problems, e.g., phase separation, problems in a preparation process due to the adhesion property of the composition (defective in the preparation due to transfer or adhesion of the photosensitive components), or precipitation from a developer. In view of these points, a preferred ratio thereof may be 5 to 80% by weight and more preferably 25 to 75% by weight based on the total weight of the photosensitive composition. The compound may be used alone or in a combination. In addition, the structure, ratio, and amount of the addition polymerizable compound may be optionally selected in the light of inhibition property by oxygen, resolution, fogging property, the change of refractive index, and adhesion property of the surface. In some cases, it may be possible to form layers such as undercoating layer and overcoating layer.

(C) Binder Polymer

The photosensitive composition used in the present invention preferably comprises a binder polymer.

The binder polymer used in the photosensitive layer of the PS plate of the present invention is preferably a linear organic polymer. Any linear organic polymer can be used as a binder. Preferably a linear organic polymer compound that is soluble or swellable in an alkali water may be used. The linear organic polymer may be selected in accordance with the purpose of the use of the polymer. For example the polymer is used not only as a film-forming material but also as a material for dissolving in a developer comprising water, weak alkali water or an organic solvent. Thus, if a water-soluble organic polymer is used, a photopolymerizable composition can be developed with water. Examples of such an organic polymer compound that is soluble or swellable in an alkali water include addition polymers having carboxyl groups on the side chains such as methacrylic acid copolymers, acrylic acid copolymers, itaconic acid copolymers, crotonic acid copolymers, maleic acid copolymers, and partially esterified maleic acid copolymers as disclosed in J.P.KOKAI Nos. Sho 59-44615, 54-92723, 59-53836 and 59-71048, and J.P.KOKOKU Nos. 54-34327, 58-12577 and 54-25957. Also, an acidic cellulose derivative having a carboxyl group on the side chain can be utilized in the binder polymer of the present invention. In addition, a polymer that is formed by adding a cyclic acid anhydride to an addition polymer having a hydroxyl group can be used.

Among these compounds, [benzyl (meth)acrylate/(meth) acrylic acid/other optional addition-polymerizable vinyl monomer] copolymers and [allyl (meth)acrylate/(meth) acrylic acid/other optional addition-polymerizable vinyl monomer]copolymers are preferred because these compounds give good strength, sensitivity and developing property to the film.

In addition, polyurethane resins having an acid group as described in J.P. KOKOKU Nos. Hei 7-120040, Hei 7-120041, Hei 7-120042, Hei 8-12424, J.P. KOKAI Nos. Sho 63-287944, Sho 63-287947, Hei 1-271741, and Hei 11-352691 are also useful in the present invention because the resins show high strength and thus, are advantageous in the printing durability and in the treatment under low exposure.

In addition, the binder having an amide group described in J.P. KOKAI No. Hei 11-171907 is preferred because the binder gives good developing property and strength to the film.

In addition, polyvinyl pyrrolidone and polyethylene oxide are useful as water-soluble linear organic polymers. Alcohol-soluble polyamides and polyethers of 2,2-bis-(4-hydroxyphenyl)-propane with epichlorohydrin are also useful for the improvement of the strength of the cured films of the resulting composition. These linear organic polymers can be incorporated into the photopolymerizable composition in any suitable amounts. However, if the amount thereof exceeds 90%, undesirable problems arise, for instance, images formed are insufficient in the strength. The amount thereof is preferably from 30 to 85%. The weight ratio of the photopolymerizable ethylenically unsaturated compound to the linear organic polymer is preferably from 1/9 to 7/3.

In a preferred embodiment, the binder polymer to be used is a polymer that is not soluble in water but soluble in an alkali. If so, the developer comprising no or a limited amount of organic solvent can be utilized and it is preferred in view of the environmental pollution. The acid value (that is a chemical equivalent number of the acid comprised in 1 g of polymer) and molecular weight of the binder polymer is suitably selected in view of the image strength and developing property. The acid value thereof preferably ranges 0.4 to 3.0 meq/g. A preferred molecular weight of the binder polymer ranges from 3,000 to 500,000. More preferably, the acid value ranges 0.6 to 2.0 meq/g and molecular weight is 10,000 to 300,000.

(D) Other Components

The photosensitive composition usable in the present invention may comprise other components depending on the utility, the preparation method and the like of the photosensitive composition. Preferred additives are described below.

(D1) Cosensitizer

The sensitivity of the composition can be increased by addition of a specific kind of additives (hereinafter, referred to as "cosensitizer"). The mode of action of the cosensitizer is not well known. But the mechanism may be based on the following chemical process. That is, a variety of intermediate species such as radical, peroxides, oxidizing agent, reducing agent and the like which are produced from the photoreaction started from the absorption by the initiation system described above and from the following addition polymerization may react with the cosensitizer to produce another active radical. The cosensitizer can be classified into (a) a compound which can produce an active radical by reduction, (b) a compound which can produce an active radical by oxidation, and (c) a compound which can react with a poorly active radical to convert the radical to more active one, or a compound which acts as a chain transfer agent. But the category of each specific compound is not well determined.

(a) Compound Which Produces an Active Radical by Reduction

A compound having a carbon-halogen bond: It is believed that the carbon-halogen bond is reductively cleaved to produce an active radical. Specific examples of such a compound include trihalomethyl-s-triazines and trihalomethyloxadiazoles.

A compound having a nitrogen-nitrogen bond: It is believed that the nitrogen-nitrogen bond is reductively cleaved by reduction to produce an active radical. A specific example thereof includes hexaarylbiimidazole.

A compound having an oxygen-oxygen bond: It is believed that the oxygen-oxygen bond is reductively cleaved by reduction to produce an active radical. A specific example thereof includes organic peroxides.

An onium compound: It is believed that carbon-hetero bond or oxygen-nitrogen bond is reductively cleaved by reduction to produce an active radical. Specific examples thereof include diaryl iodnium salts, triaryl sulfonium salts, N-alkoxypyridinium (azinium) salts and the like.

A ferrocene or iron-arene complex: It is believed that the compound reductively produces an active radical.

(b) Compound Which Produces an Active Radical by Oxidation.

An alkyl ate complex: It is believed that the carbon-hetero bond is oxidatively cleaved to produce an active radical. A specific example thereof includes triarylalkylborates.

An alkylamine compound: It is believed that C—X bond on the carbon atom that is adjacent to nitrogen atom is cleaved by oxidation to produce an active radical. Examples of X include hydrogen atom, carboxyl group, trimethylsilyl group, benzyl group and the like. Specific examples thereof include ethanolamines, N-phenylglycines, N-trimethylsilyl methylanilines and the like.

A compound comprising a sulfur atom or tin atom: It is believed that the compound which has sulfur atom or tin atom in place of nitrogen atom of the amines described above likewise produces an active radical. Also, it is known that a compound having S—S bond shows sensitizing effect through cleavage thereof of the S—S bond.

An α-substituted methylcarbonyl compound: It is believed that the carbonyl-α carbon bond is cleaved by oxidation to produce an active radical. Also a compound having an oxime ether in place of carbonyl group likewise produces an active radical. Specific examples thereof include 2-alkyl-1-[4-(alkylthio)phenyl]-2- morpholinopronone-1, and oxime ether thereof that is prepared by reacting with hydroxyamines followed by etherification of N—OH group.

A salt of sulfinic acid: It is believed that the compound reductively produces an active radical. A specific example thereof includes sodium arylsulfinate.

(c) Compound Which Reacts with a Radical to Convert it to a Highly Active Radical, or a Compound Which Acts as a Chain Transfer Agent For example, compounds having a SH, PH, SiH, or GeH group in a molecule can be utilized. The compound may transfer the hydrogen atom to a poorly active radical species to produce a radical. The compound also may be oxidized and then be deprotonated to produce a radical. A specific example thereof includes 2-mercaptobenzimidazoles.

More specific examples of the cosensitizer are described in, for example, J.P. KOKAI No. Sho 9-236913 as additives to improve the sensitivities. Hereinafter some examples described therein will be explained. But the present invention is not limited thereto.

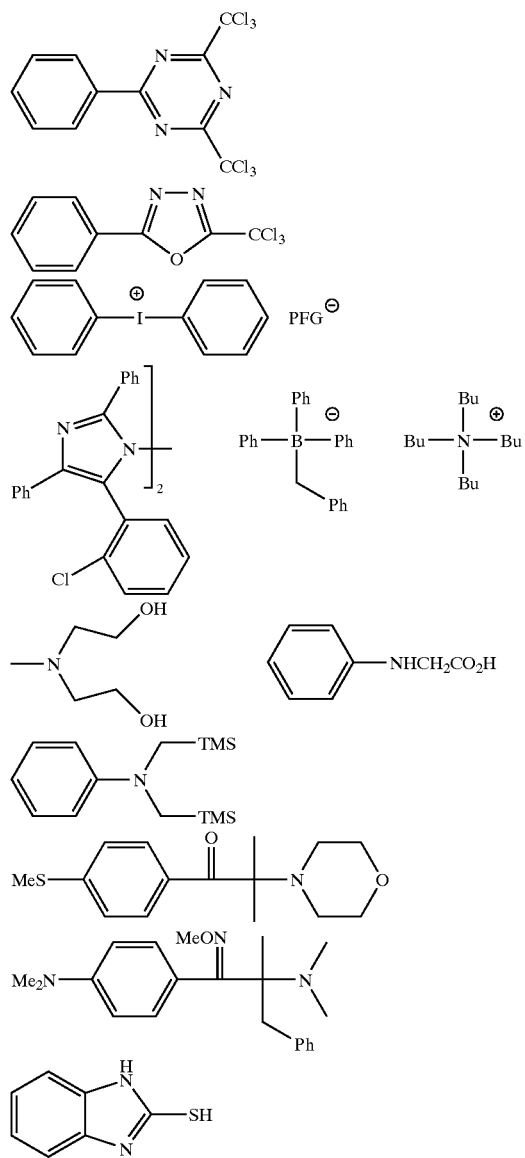

The cosensitizers may be modified to improve the property of the photosensitive layer as described for the sensitizing dyes. For example, the cosensitizers can be modified by connecting with a part of the sensitizing dyes, activating agent or addition polymerizable unsaturated compound, by introducing a hydrophilic group, by improving a compatibility of the compound, by introducing a substituent to inhibit precipitation of crystals, by introducing a substituent to improve the adherence or by polymerization.

These cosensitizers can be used alone or in a combination. The amount to be used ranges 0.05 to 100 parts by weight, preferably 1 to 80 parts by weight, and more preferably 3 to 50 parts by weight, based on 100 parts by weight of the compound having an ethylenically unsaturated double bond.

(D2) Inhibitor for Polymerization

In addition to the above components, it is preferred that the photosensitive layer may further comprise an inhibitor for heat polymerization. For example, hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenylhydroxyamine cerium salt and the like are useful. The amount of the heat polymerization inhibitor based on the total weight of the photosensitive composition ranges preferably from about 0.01% to about 5% by weight. Also, if necessary, a higher fatty acid derivative such as behenic acid and behenic acid amide may be added to the photosensitive composition to inhibit the blocking of polymerization by oxygen. The higher fatty acid derivative may be distributed on the surface of the photosensitive layer during drying process after application. The amount of the higher fatty acid derivative is preferably in the range of about 0.5% to about 10% by weight based on the total weight of the photosensitive composition.

(D3) Coloring Agent

In addition, a dye or pigment may be added to the photosensitive layer as a coloring agent to color the layer. It may be possible to improve the property relating to checkup of the plate, e.g., adaptability to a device for measuring the image density, or visualization of the image after processing the plate. Many dyes decrease the sensitivity of the photosensitive layer. Therefore, a pigment is preferably used. Examples of the coloring agent include phthalocyanine pigments, azo pigments, carbon black, titanium oxide pigments, ethyl violet, crystal violet, azo dyes, anthraquinone dyes, and cyanine dyes. The amount of the dyes or pigments preferably ranges from about 0.5% to about 5% by weight on the basis of the total weight of the photosensitive composition.

(D4) Other Additives

Additionally, in order to improve the property of the formed film, an additive such as an inorganic filler and plasticizer, e.g., dioctyl phthalate, dimethyl phthalate and tricresyl phosphate, can be added. In addition, a conventional additive such as an agent that improves the holding property of ink on the surface of the photosensitive layer may be added.

Examples of plasticizer include dioctyl phthalate, didodecyl phthalate, triethyleneglycol dicaprylate, dimethylglycol phthalate, tricresyl phosphate, dioctyl adipate, dibutyl sebacate, and triacetylglycerin. If a binder is used, the additive can be added in an amount of 10% by weight or less based on the total weight of the compound comprising ethylenically unsaturated double bond and the binder.

In addition, UV initiator or heat cross-linker can be added to improve the strength of the formed film (printing durability) by increasing the effect of heating and exposing step after development of the plate. Examples of UV initiator usable in the present invention include (thio)xanthones, trihalomethyltriazines, Michler's ketones, benzoin ethers, benzyls, "a polymer having a photopolymerization initiator" as described in J.P. KOKAI No. 2000-89478, and "a compound having a polymerizable unsaturated group and a polymerization initiating group which is photosensitive to ultraviolet light" as described in J.P. KOKAI No. 2000-267266.

In addition, an additive that improves the adhesion of photosensitive layer and substrate or improves the removability of the unexposed area of photosensitive layer through development may be added or an intermediate layer providing foregoing property may be formed. For example, a compound having a diazonium structure, phosphone compound or a compound showing a relatively high interaction against the substrate may be added or may be undercoated to improve the adhesion of the photosensitive layer and to improve the printing durability thereof. Also, a hydrophilic polymer such as polyacrylic acid and polysulfonic acid may be added to improve the developing property of the non-image area to thus reduce the contamination on the printings.

When the photosensitive composition of the present invention is applied onto a substrate to prepare a PS plate, the composition may be dissolved in a solvent selected from a variety of organic solvents. Examples of the solvent include acetone, methyl ethyl ketone, cyclohexane, ethyl acetate, ethylene dichloride, tetrahydrofuran, toluene, ethyleneglycol monomethyl ether, ethyleneglycol monoethyl ether, ethyleneglycol dimethyl ether, propyleneglycol monomethyl ether, propyleneglycol monoethyl ether, acetylacetone, cyclohexanone, diacetonealcohol, ethyleneglycol monomethyl ether acetate, ethyleneglycol ethyl ether acetate, ethyleneglycol monoisopropyl ether, ethyleneglycol monobutyl ether acetate, 3-methoxypropanol, methoxymethoxyethanol, diethyleneglycol monomethyl ether, diethyleneglycol monoethyl ether, diethyleneglycol dimethyl ether, diethyleneglycol diethyl ether, propyleneglycol monomethyl ether acetate, propyleneglycol monoethyl ether acetate, 3-methoxypropyl acetate, N,N-dimethylformamide, dimethylsulfoxide, γ-butyrolactone, methyl lactate, ethyl lactate. The solvent can be used alone or in a combination. The amount of the solid in the coating solution is suitably in the range of 2% to 50% by weight.

The amount of the photosensitive layer coated on a substrate is influencable to the sensitivity or development adaptability of the photosensitive layer and to the strength of the exposed film or printing durability. Therefore, the amount of the photosensitive layer is desirably selected depending on the purpose of the PS plate. If the coating amount of the photosensitive layer is not sufficient, the printing durability of the thus obtained printing plate is lowered. In contrast, if the amount is excessive, the sensitivity of the photosensitive layer is decreased to thus delay the exposing time and to affect the time for development. If the presensitized plate is that for scanning exposure, the coating amount of the photosensitive layer after dried may be in the range of about 0.1 g/m$^2$ to about 10 g/m$^2$, and more preferably from 0.5 g/m$^2$ to 5 g/m$^2$.

(Substrate)

The PS plate usable in the present invention may be prepared by coating the photosensitive layer described above on a substrate having a hydrophilic surface. Examples of the suitable substrate include a paper, a paper laminated with a plastic film (such as polyethylene, polypropylene and polystyrene film), a metal plate such as aluminum (including aluminum-containing alloy), zinc and copper plate, a plastic film such as cellulose diacetate, cellulose triacetate, cellulose propionate, polyethylene terephthalate, polyethylene-polypropylene, polycarbonate, polyvinyl acetal and the like, a paper or a plastic film laminated or deposited with the aforementioned metal and a copper plate coated with aluminum or chromium. Further, the surface of the substrate may be treated physically or chemically via conventional methods to give a hydrophilicity and/or strength to the surface of the substrate.

Among these substrates, preferred is a paper, polyester film or aluminum plate. A particularly preferred is an aluminum plate because of their high dimensional stability, low cost and good adhesion to the light-sensitive layer or the like. Besides, a composite sheet that comprises a polyethylene terephthalate film bonded with an aluminum sheet as disclosed in J.P. KOKOKU No. Sho 48-18327 is also preferably used in the invention.

Preferred aluminum plates are, for instance, those of pure aluminum or an aluminum alloy comprising aluminum and a trace amount of other elements as well as plastic films laminated with an aluminum film or on which aluminum is vapor-deposited. Examples of the trace elements are silicon, iron, manganese, copper, magnesium, chromium, zinc, bismuth, nickel and/or titanium. The amount of the elements other than aluminum is at most 10% by weight. The aluminum substrate preferably used in the invention is a pure aluminum plate, but it is presently difficult to obtain a completely pure aluminum plate from the viewpoint of refining technique. Therefore, an aluminum plate containing other elements as low as possible is employed. The aluminum plate containing other elements in the order of the foregoing range can be used in the invention without any problem. In other words, the aluminum plates usable in the invention are not restricted to those having specific compositions and may be those commonly known and used in this art. The aluminum plate used in the invention has a thickness in the order of about 0.1 mm to 0.6 mm, preferably from 0.15 mm to 0.4 mm, and particularly preferably from 0.2 mm to 0.3 mm.

If a substrate has a metal surface, particularly an aluminum surface, the surface is preferably treated by, for example, surface-roughening treatment, dipping treatment in an aqueous solution of sodium silicate, potassium fluorozirconate or phosphoric acid salt and/or anodization treatment.

Such surface-roughening treatments are, for instance, mechanical surface-roughening treatments, methods for electrochemically dissolving the surface and methods for chemically and selectively dissolving the surface. The mechanical surface-roughening treatments can be carried out by any known methods such as ball graining, brush graining, blast graining and buff graining methods. In addition, the electrochemical surface-roughening treatment is, for instance, conducted by passing an alternating or direct current through the aluminum plate in an electrolyte such as hydrochloric acid or nitric acid. Moreover, it is also possible to use combinations of these two kinds of methods as disclosed in J.P. KOKAI No. Sho 54-63902. The aluminum plate may optionally be subjected to degreasing treatments by treating with, for example, surfactant, organic solvent, or alkaline aqueous solution before the plate is surface-roughened.

The aluminum plate treated by dipping in an aqueous solution of sodium silicate after graining can be preferably used. The aluminum plate that is anodized and then dipped in an aqueous solution of an alkali metal silicate as disclosed in J.P. KOKOKU No. Sho 47-5125 can preferably be used. The foregoing anodization treatment is performed by passing an electric current through the aluminum plate serving as an anode in an electrolyte such as an aqueous or non-aqueous solution of an inorganic acid such as phosphoric acid, chromic acid, sulfuric acid or boric acid, or an organic acid such as oxalic acid and sulfamic acid or a mixture thereof.

Silicate electrodeposition as disclosed in U.S. Pat. No. 3,658,662 is also effective as a surface treatment of the aluminum plates. It is likewise useful to subject the aluminum plates to a surface-treatment comprising the combination of the foregoing anodization and dipping treatment in a solution of sodium silicate with the electrolytic graining treatment as disclosed in J.P. KOKOKU No. Sho 46-27481, and J.P. KOKAI Nos. Sho 52-58602 and Sho 52-30503.

An example of preferred aluminum plate further includes that which is mechanically surface-roughened, chemically etched, electrolytically grained, anodized and then treated with sodium silicate as disclosed in J.P. KOKAI No. Sho 56-28893. Also, an example of aluminum plate preferably used herein includes that which is subjected to the foregoing treatments and to which an underlying coating is applied. Examples of materials for such underlying coating layers include water-soluble resins such as polyvinylphosphonic acid, polymers and copolymers having sulfonic groups on the side chains and polyacrylic acid; water-soluble metallic salts such as zinc borate; yellow dyes; and amine salts.

A substrate which is sol-gel treated by covalently binding a functional group which initiates addition reaction by a radical as disclosed in J.P. KOKAI No. Hei 7-159983 may be preferably utilized.

A substrate having as a hydrophilic layer that shows water resistance property can be preferably used. Examples of such a layer include those consisting of inorganic pigment and an integrating agent as disclosed in U.S. Pat. No. 3,055,295, or J.P. KOKAI No. Sho 56-13168, a hydrophilic swelling layer as disclosed in J.P. KOKAI No. Hei 9-80744, and sol-gel film consisting of titanium oxide, polyvinylalcohol and silicic acids as disclosed in J.P. KOHYO No. Hei 8-507727.

These treatments are conducted to give hydrophilicity to the surface of the substrate, to inhibit the side reaction of photopolymerizable composition, and to improve the adhesion of the photosensitive layer to the substrate.

(Protective Layer)

In the present invention, a protective layer is preferably coated on the layer of photopolymerizable composition that is to be exposed to light under atmospheric condition. The protective layer inhibits penetration of low molecular compound such as oxygen present in an air or basic compound that prevents the image-forming reaction occurred by exposing the photosensitive layer to light. Thus, it may be possible to expose the plate in the air by forming the protective layer. Therefore, the protective layer desirably has the following properties; permeability of low molecular compound such as oxygen is low but the permeability of light utilized for exposure of the plate is not substantially inhibited; adherence of the protective layer to the photosensitive layer is good and the protective layer can be easily removed in the development step after the exposure.

For example, a method for formation of the protective layer is described in U.S. Pat. No. 3,458,311, and J.P.KOKOKU No. 55-49729. Examples of material that can be utilized for the protective layer include water-soluble polymers that have relatively high crystality. Specific examples thereof include water-soluble polymers such as polyvinyl alcohol, polyvinyl pyrrolidone, acidic cellulose, gelatin, gum arabic, and polyacrylic acid. Among them, it provides best results in oxygen blocking property and developing property of the layer to use polyvinyl alcohol as a basic component. The polyvinyl alcohol compound utilized for the protective layer may be partially replaced by an ester, ether or acetal as long as the compound comprises unsubstituted vinyl alcohol unit which provides oxygen blocking property and water-solubility. In addition, the compound may comprise another copolymer component.

Examples of the polyvinyl alcohol include those having a degree of saponification of 71% to 100% and a degree of polymerization of 300 to 2400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, L-8 (available from Kuraray Co. Ltd.) and the like.

The components in the protective layer, e.g., a kind of PVA and use of additives or coating amount of the layer can be selected taking the oxygen blocking property, removability through development, fogging property, adhesion property and resistant property to damage of the layer into account. Generally, if the degree of saponification of PVA is high, in other words, if the ratio of unsubstituted vinyl alcohol unit in the protective layer is high, a higher oxygen blocking performance is observed in a thicker film and thus, it is advantageous in the sensitivity. However, if the oxygen blocking performance becomes so high, undesirable polymerization reaction may occur during the preparation or storage or a problem of undesirable fogging or overgrowth of a line may occur.

In addition, the adhesion property of the image portion and the resistance to damage are very important when the plate is processed. That is, when a hydrophilic layer consisting of water-soluble polymer is coated on a oleophilic polymerizing layer, the layer is easily abraded since the adhesion property is not sufficient. As the result, a problem that the film is not sufficiently hardened may occur since polymerization of the abraded portion may be inhibited by oxygen.

A variety of means to improve the adhesion property between two layers have been proposed. For example, U.S. Pat. Nos. 292,501 and 44,563 describe that the adhesion property was improved by coating a mixture comprising a hydrophilic polymer mainly consisting of polyvinyl alcohol and 20 to 60% by weight of acrylic emulsion or water-insoluble copolymer of vinyl pyrrolidone-vinyl acetate on a polymer layer. These known techniques can be applied to the protective layer of the present invention. For example, a method for formation of such a protective layer is described in U.S. Pat. No. 3,458,311, and J.P. KOKOKU No. 55-49729.

In addition, additional function can be added to the protective layer. For example, it may be possible to improve the safelight suitability without decreasing the sensitivity of the layer by adding a coloring agent (water-soluble dye and etc.) that has excellent permeability to the light having a wavelength of 350 to 450 nm and that absorbs the light having a wavelength of 500 nm or more.

(Development)

The method of the present invention comprises imagewise scanning exposure of the presensitized plate having a photopolymerizable layer and removing the non-exposed area in the photopolymerizable layer to obtain an image. Preferred examples of the developer for the lithographic printing plate having a photopolymerizable composition include that described in J.P. KOKOKU No. Sho 57-7427 and an aqueous solution of inorganic alkaline agent such as sodium silicate, potassium silicate, sodium hydroxide, potassium hydroxide, lithium hydroxide, trisodium phosphate, dibasic sodium phosphate, trobasic ammonium phosphate, dibasic ammonium phosphate, sodium metasilicate, sodium bicarbonate, and ammonia water, or organic alkaline agent such as monoethanolamine and diethanolamine. The agent can be added so that the concentration of the alkaline solution becomes in the range of 0.1 to 10% by weight and preferably in the range of 0.5 to 5% by weight.

The alkaline aqueous solution may comprise a small amount of a surfactant or organic solvent such as benzyl alcohol, 2-phenoxyethanol and 2-butoxyethanol, if necessary. Examples thereof include that described in U.S. Pat. Nos. 3,615,480 and 3,375,171. Also the developers disclosed in J.P. KOKAI No. Sho 50-26601 and J.P. KOKOKU Nos. Sho 56-39464 and Sho 56-42860 can be effectively used in the present invention.

The developing treatment can be conducted by a conventional automatic processor or developing machine. Examples thereof include LP-850P, LP-850PII (available from Fuji Photo Film Co. Ltd.), VSP (available from Agfa), and FLP105, FLP82 News (available from Technigraph). In addition, in the process of the present invention, it may be possible to heat the whole surface of the plate before, during or after exposing it to light but before development, if necessary. Therefore, an automatic processor preferably has a heating part before the developing part. By heating the plate before development, the image-forming reaction proceeded in the photosensitive layer is accelerated to give advantages such as improvement of sensitivity, printing durability and stabilization of sensitivity. In addition, it is efficient to heat or to expose the whole surface of the developed image to improve the image strength and printing durability. Generally, heating of the plate before the development is preferably conducted under a mild condition, e.g., at the temperature of 150° C. or lower. If the temperature is too high, non-image area may also be fogged. In contrast, heating of the plate after the development may be conducted under a strong condition. Usually, it may be conducted at the temperature of 200 to 500° C. If the temperature is too low, sufficient strength of the image can not be obtained and if the temperature is too high, the substrate may be deteriorated or the image area may be pyrolyzed.

It is preferred to wash the plate with water before the development thereof since it may be possible to reduce the weariness of the developer. Accordingly, it is preferred that the automatic processor has a water-rinsing part before the developing part.

EXAMPLES

The present invention will be explained by the following examples, but the present invention is not limited by the examples.

Examples 1 to 8 and Comparative Examples 1 to 2

(Preparation of Substrate)

An aluminum plate having a thickness of 0.3 mm was immersed in 10% by weight of sodium hydroxide solution at 60° C. for 25 seconds to etch the plate. The plate was washed with running water, was neutralized with 20% by weight of nitric acid and was washed with water. Then, an electrolytic graining of the plate was conducted in a 1% by weight of aqueous solution of nitric acid using a rectangle alternating continuous wave voltage with an anode electric amount of 300 coulomb/dm$^2$. The plate was then immersed in a 1% by weight of aqueous solution of sodium hydroxide at 40° C. for 5 seconds. The plate was then immersed in a 30% $H_2SO_4$ for 40 seconds at 60° C. to desmut the surface thereof. Then, the plate was anodized in a 20% by weight of aqueous solution of sulfuric acid using an electric current density of 2 A/dm$^2$ for 2 minutes to obtain a substrate having an anodized layer of which thickness was 2.7 g/m$^2$. The roughness of the surface of the plate was 0.3 μl in (expressed as Ra, JIS B0601).

The backside of the thus treated substrate was coated with the following solution for sol-gel reaction with a bar coater and it was then dried at 100° C. for 1 minute to thus prepare a substrate having a backcoat layer in an amount of 70 mg/m$^2$ after dried.

| Composition for sol-gel reaction | |
|---|---|
| Tetraethyl silicate | 50 parts by weight |
| Water | 20 parts by weight |
| Methanol | 15 parts by weight |
| Phosphoric acid | 0.05 parts by weight |

The components were combined together and the mixture was stirred for about 5 minutes. Then an exothermic reaction was started. After 60 minutes, the following solution was added thereto to prepare a coating solution for backcoat layer.

| | |
|---|---|
| Pyrogallol-formaldehyde condensation resin (molecular weight: 2000) | 4 parts by weight |
| Dimethyl phthalate | 5 parts by weight |
| Fluorine atom-containing surfactant (N-butylperfluorooctanesulfoneamideethyl acrylate/polyoxyethylene acrylate copolymer (molecular weight: 20,000) | 0.7 parts by weight |
| Methanol silica sol (available from Nissan Chemical Industry (Co. Ltd.), methanol 30% by weight) | 50 parts by weight |
| Methanol | 800 parts by weight |

(Preparation of Photosensitive Layer)

The photopolymerizable composition described below was coated on the thus treated aluminum plate so that the amount of the coated composition becomes 1.0 g/m$^2$, and the plate was then dried at 80° C. for 2 minutes to form a photosensitive layer.

| | |
|---|---|
| Pentaerythritol tetraacrylate | 1.5 g |
| Allyl methacrylate/methacrylic acid copolymer (molar ratio 83/17) | 2.0 g |
| Photopolymerization initiation system | |
| Sensitizing dye: D-21 | 0.06 g |
| Titanocene compound: T-1 | 0.06 g |
| Cosensitizer H1 (compound described below) | 0.2 g |

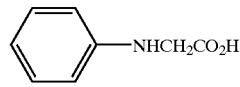

| | |
|---|---|
| Fluorine atom-containing nonionic surfactant (F-177P) | 0.02 g |
| Inhibitor for heat polymerization, N-nitrosophenylhydroxyl | 0.01 g |
| Dispersion of pigment | 2.0 g |
| (Composition of pigment dispersion) | |
| Pigment Blue 15:6 | 15 parts by weight |
| Allyl methacrylate/methacrylic acid copolymer (molar ratio 83/17) | 10 parts by weight |
| Cyclohexanone | 15 parts by weight |
| Methoxypropyl acetate | 20 parts by weight |
| Propyleneglycol monomethyl ether | 40 parts by weight |
| Methyl ethyl ketone | 20.0 g |
| Propyleneglycol monomethyl ether | 20.0 g |

(Preparation of Protective Layer)

A 3% by weight aqueous solution of polyvinylalcohol (saponification percentage: 98% by mole, degree of polymerization: 550) was coated on the photosensitive layer so that the coating amount thereof after dried becomes 2 g/m$^2$, and then the plate was dried at 100° C. for 2 minutes.

The thus obtained plate is referred to as "PS plate 1".

"PS plate 1" was exposed to light by scanning InGaN-type semiconductor laser having an oscillatory wavelength of 400 nm or shorter under the conditions wherein beam diameter at the surface of the plate was 25 μm and the energy density of exposure was 0.15 mJ/cm$^2$, the exposure was 0.03 mJ/cm$^2$, the line was 175 lpi, and the resolution was 4000 dpi.

Then, the plate was subjected to standard process through an automatic processor (Fuji Photo Film Co. Ltd., LP-850P2) comprising the developer described below and finishing gum solution FP-2W (available from Fuji Photo Film Co. Ltd.).

(Developer)

The developer was prepared by diluting the liquid consisting of the following components with 5 times of water

| | |
|---|---|
| Ethylenediamine tetraacetate 4 sodium salts-4 hydrates | 0.8 g |
| Potassium carbonate | 0.8 g |
| Newcol B13 (available from Nippon Nyukazai, chemical structure is shown below) | 25 g |
| Pure water | 72.25 g |

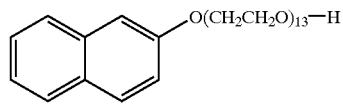

The thus developed lithographic printing plate was subjected to exposure to light under the condition described in Table 1 (Examples 1 to 8 and Comparative examples 1 and 2)

The solid printing durability and highlight printing durability of the thus prepared PS plates were evaluated as follows. The results are shown in Table 1.

[Test for Solid Printing Durability]

This test was conducted using R201-type printer available from Man•Roland company and GEOS-G(N) ink (available from Dainippon Ink and Chemicals, Inc.). The number of the printings obtained before the image becomes weak and the number was used as an index for solid printing durability. The bigger number indicates a higher durability.

[Test for Highlight Printing Durability]

This test was conducted using R201-type printer available from Man•Roland company and GEOS-G(N) ink (available from Dainippon Ink and Chemicals, Inc.) and the number of printings obtained before dots loss on 3% mesh of 175 lpi was determined by observation to evaluate the printing durability of the lithographic printing plate. The number of the printings obtained was used as an index for highlight printing durability. The bigger number indicates a higher durability.

Examples 9 to 16 and Comparative Examples 3 and 4

The preparation of substrate, coating of backcoat layer, preparation and coating of photosensitive layer and preparation and coating of protecting layer was conducted as described in Example 1, provided that the following photopolymerization initiation system was used. The thus obtained PS plate was referred to as "PS plate 2".

| Photopolymerization initiation system | |
|---|---|
| Sensitizing dye: D-1 | 0.1 g |
| Titanocene compound: T-1 | 0.1 g |
| Cosensitizer (None) | |

PS plate 2 was exposed to light and developed as described in Example 1 and the solid printing durability and the highlight printing durability were evaluated. The results are shown in Table. 1.

TABLE 1

| | PS plate | Exposure of the whole surface | | | Heating with Exposure | | Solid printing durability | Highlight printing durability |
|---|---|---|---|---|---|---|---|---|
| | | Device | Condition | Amount of light (mJ/cm$^2$) | Device · Condition | Temperature of surface (° C.) | | |
| Example No. | | | | | | | | |
| 1 | 1 | EX.*$^2$ | 1.4 m/min | 240 | EX.*$^2$ · 1.4 m/min | 40 | 250,000 | 100,000 |
| 2 | 1 | EX.*$^2$ | 0.7 m/min | 480 | EX.*$^2$ · 0.7 m/min | 40 | 250,000 | 100,000 |
| 3 | 1 | Eye*$^3$ | 1 m/12 sec | 240 | None | 25 | 200,000 | 80,000 |
| 4 | 1 | Eye*$^3$ | 1 m/120 sec | 2400 | None | 25 | 350,000 | 300,000 |
| 5 | 1 | Eye*$^3$ | 1 m/240 sec | 4800 | None | 25 | 400,000 | 350,000 |
| 6 | 1 | Eye*$^3$ | 1 m/480 sec | 9600 | None | 25 | 450,000 | 400,000 |
| 7 | 1 | Eye*$^3$ | 1 m/120 sec | 2400 | Hot plate F-202H*$^6$ | 100 | 400,000 | 350,000 |
| 8 | 1 | UV*$^4$ | 1.7 m/min | 2400 | UV*$^4$ · 1.7 m/min | 100 | 400,000 | 350,000 |
| 9 | 2 | EX.*$^2$ | 1.4 m/min | 240 | EX.*$^2$ · 1.4 m/min | 40 | 250,000 | 100,000 |
| 10 | 2 | EX.*$^2$ | 0.7 m/min | 480 | EX.*$^2$ · 0.7 m/min | 40 | 250,000 | 100,000 |
| 11 | 2 | Eye*$^3$ | 1 m/12 sec | 240 | None | 25 | 200,000 | 80,000 |
| 12 | 2 | Eye*$^3$ | 1 m/120 sec | 2400 | None | 25 | 350,000 | 300,000 |
| 13 | 2 | Eye*$^3$ | 1 m/240 sec | 4800 | None | 25 | 400,000 | 350,000 |
| 14 | 2 | Eye*$^3$ | 1 m/480 sec | 9600 | None | 25 | 450,000 | 400,000 |
| 15 | 2 | Eye*$^3$ | 1 m/120 sec | 2400 | Hot plate F-202H*$^6$ | 100 | 400,000 | 350,000 |
| 16 | 2 | UV*$^4$ | 1.7 m/min | 2400 | UV*$^4$ · 1.7 m/min | 100 | 400,000 | 350,000 |
| Comp. Ex. No. | | | | | | | | |
| 1 | 1 | None | None | None | None | None(25) | 130,000 | 40,000 |
| 2 | 1 | None | None | None | PH-200*$^5$ · 120° C./2 min*$^7$ | 100 | 130,000 | 40,000 |
| 3 | 2 | None | None | None | None | None(25) | 130,000 | 40,000 |
| 4 | 2 | None | None | None | PH-200*$^5$ · 120° C./2 min*$^7$ | 100 | 130,000 | 40,000 |

*$^1$The amount of light was determined using actinograph UV-MO2 (ORC Co. Ltd.) at 420 nm,
*$^2$EXTENDER (Metal halide lamp, Master Group Co. Ltd.),
*$^3$Eyedolphin 3000 (Metal halide lamp, Eyegraphics Co. Ltd.),
*$^4$UV irradiation device (Nippon Battery Co. Ltd., Type75A-12-A1-1(D2-028)),
*$^5$Convection Oven (TABAI Corp.),
*$^6$Tokyo Glassware and Instrument Co. Ltd.,
*$^7$The plate was heated without exposure to light The method for making a lithographic printing plate comprising imagewise scanning exposure of a presensitized plate having a photopolymerizable layer on a substrate which has a hydrophilic surface to a laser light with the wavelength of 450 nm or shorter, developing the exposed plate with a developer and further exposing the whole surface of the developed plate to a light with the wavelength of 450 nm or shorter, provides a lithographic printing plate which reduces a fog of reflection that is easily occurred in an inner drum type exposing device during a direct process to provide a clear image as well as a high printing durability.

What is claimed is:

1. A method for making a lithographic printing plate, which comprises imagewise exposing a presensitized plate having a photopolymerizable layer on a substrate having a hydrophilic surface by scanning the plate with laser light having a wavelength of 450 nm or shorter, developing the exposed plate with a developer and further exposing the whole surface of the developed plate to light having a wavelength of 450 nm or shorter, wherein the lithographic printing plate is heated to a temperature ranging from 30° C. to 150° C. simultaneously with the exposure of the whole surface of the plate to light, and wherein the photopolymerizable layer comprises a sensitizing dye represented by the following general formula (1):

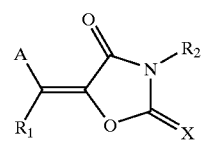

(1)

wherein, A represents an optionally substituted aromatic ring or heterocyclic ring, X represents oxygen atom, sulfur atom or —N(R$_3$)—, R$_1$, R$_2$ and R$_3$ each independently represents hydrogen atom or monovalent nonmetallic atom group and A and R$_1$, or R$_2$ and R$_3$ can be linked together to form an aliphatic or an aromatic ring.

2. The method of claim 1, wherein the amount of light for imagewise-exposure ranges from 0.01 mJ/cm$^2$ to 1 mJ/cm$^2$.

3. The method of claim 2, wherein the amount of light for exposing the whole surface of the plate is at least 100 times greater than the amount of light used for the imagewise-exposure.

4. The method of claim 1, wherein the amount of light for exposing the whole surface of the plate is at least 100 times greater than the amount of light used for imagewise-exposure.

5. The method of claim 1, wherein the photopolymerizable layer is formed from a photosensitive composition which comprises (A) a photopolymerization initiation system comprising the sensitizing dye and (B) at least one compound of which physical or chemical property is irreversibly changed upon contact with radical or acid.

6. The method of claim 5, wherein the photosensitive composition further comprises (C) a binder polymer.

7. The method of claim 5, wherein the (A) photopolymerization initiation system comprises (A1) the sensitizing dye and (A2) a titanocene compound.

8. The method of claim 5, wherein the component (B) is an addition polymerizable compound.

* * * * *